(12) United States Patent
Chung et al.

(10) Patent No.: US 9,857,049 B2
(45) Date of Patent: Jan. 2, 2018

(54) LED ILLUMINATION DEVICE

(71) Applicant: PARAGON SEMICONDUCTOR LIGHTING TECHNOLOGY CO., LTD., New Taipei (TW)

(72) Inventors: Chia-Tin Chung, Miaoli County (TW); Shen-Ta Yang, Taipei (TW); Shiou-Liang Yeh, Taoyuan County (TW)

(73) Assignee: PARAGON SEMICONDUCTOR LIGHTING TECHNOLOGY CO., LTD., New Taipei (TW)

( * ) Notice: Subject to any disclaimer, the term of this patent is extended or adjusted under 35 U.S.C. 154(b) by 192 days.

(21) Appl. No.: 14/931,780

(22) Filed: Nov. 3, 2015

(65) Prior Publication Data

US 2017/0122501 A1    May 4, 2017

(51) Int. Cl.
| | |
|---|---|
| *F21V 3/02* | (2006.01) |
| *F21S 8/06* | (2006.01) |
| *F21V 17/02* | (2006.01) |
| *F21V 17/06* | (2006.01) |
| *F21V 21/112* | (2006.01) |
| *H01L 25/075* | (2006.01) |
| *H01L 33/54* | (2010.01) |

(Continued)

(52) U.S. Cl.
CPC .................. *F21V 3/02* (2013.01); *F21K 9/20* (2016.08); *F21K 9/69* (2016.08); *F21S 8/06* (2013.01); *F21V 17/02* (2013.01); *F21V 17/06* (2013.01); *F21V 21/112* (2013.01); *F21V 29/70* (2015.01); *F21V 29/89* (2015.01); *F21Y 2105/10* (2016.08); *F21Y 2115/10* (2016.08); *H01L 25/0753* (2013.01); *H01L 33/54* (2013.01); *H01L 33/62* (2013.01)

(58) Field of Classification Search
CPC ... F21K 9/30; F21K 9/50; F21V 29/50; F21Y 2101/02
USPC ....... 362/249.02, 311.02, 345, 294, 218, 254
See application file for complete search history.

(56) References Cited

U.S. PATENT DOCUMENTS

| | | | |
|---|---|---|---|
| 8,368,292 B2 * | 2/2013 | Hsu ....................... | F21V 29/004 313/46 |
| 2011/0205742 A1 * | 8/2011 | Lee .......................... | F21V 5/04 362/294 |

(Continued)

*Primary Examiner* — Laura Tso
(74) *Attorney, Agent, or Firm* — Li & Cai Intellectual Property (USA) Office (57) ABSTRACT

A LED illumination device includes a carrier structure, a suspension structure, and a light-emitting structure. The carrier structure includes a carrier body and a first heat-conducting body fixedly disposed inside the carrier body. The carrier body has an outer thread structure disposed on an outer perimeter surface. The first heat-conducting body has a bottom contacting surface exposed from a bottom side of the carrier body. The suspension structure includes a first suspension element detachably disposed on a top side of the carrier body. The light-emitting structure includes a circuit substrate and a light-emitting unit. The circuit substrate is detachably disposed on the bottom side of the carrier body to contact the bottom contacting surface of the first heat-conducting body, and the light-emitting unit is disposed on the circuit substrate. Therefore, heat generated by the light-emitting unit is guided to the first heat-conducting body through the circuit substrate.

10 Claims, 10 Drawing Sheets

(51) Int. Cl.
*H01L 33/62* (2010.01)
*F21V 29/70* (2015.01)
*F21V 29/89* (2015.01)
*F21K 9/20* (2016.01)
*F21Y 105/10* (2016.01)
*F21Y 115/10* (2016.01)
*F21K 9/69* (2016.01)

(56) References Cited

U.S. PATENT DOCUMENTS

2012/0075858 A1* 3/2012 Hsieh .................. F21K 9/23
 362/249.02
2012/0206921 A1* 8/2012 Chang .................. F21K 9/00
 362/311.02
2013/0058087 A1* 3/2013 Chang .................. F21V 21/03
 362/249.02
2014/0126202 A1* 5/2014 Kachala ............... F21V 3/0463
 362/235
2014/0211474 A1* 7/2014 Juan .................... F21V 15/01
 362/267

* cited by examiner

LED ILLUMINATION DEVICE

BACKGROUND OF THE INVENTION

1. Field of the Invention

The instant disclosure relates to an illumination device, and more particularly to a LED illumination device.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices.

SUMMARY OF THE INVENTION

One aspect of the instant disclosure relates to a LED illumination device.

One of the embodiments of the instant disclosure provides a LED illumination device, comprising a carrier structure, a suspension structure, a light-emitting structure, and a lampshade structure. The carrier structure includes a carrier body and a first heat-conducting body fixedly disposed inside the carrier body. The carrier body has an outer thread structure disposed on an outer perimeter surface, and the first heat-conducting body has a bottom contacting surface exposed from a bottom side of the carrier body. The suspension structure includes a first suspension element detachably disposed on a top side of the carrier body. The light-emitting structure includes a circuit substrate and a light-emitting unit. The circuit substrate is detachably disposed on the bottom side of the carrier body to contact the bottom contacting surface of the first heat-conducting body, and the light-emitting unit is disposed on the circuit substrate and electrically connected to the circuit substrate. The lampshade structure includes an opaque outer casing with a light-transmitting opening and a transparent element. The opaque outer casing is detachably disposed on the bottom side of the carrier body to cover the light-emitting structure, and the transparent element is detachably disposed on the opaque outer casing to enclose the light-transmitting opening. Therefore, the heat generated by the light-emitting unit is guided to the first heat-conducting body through the circuit substrate, and light source generated by the light-emitting unit is projected outwardly through the transparent element.

Another one of the embodiments of the instant disclosure provides a LED illumination device, comprising a carrier structure, a suspension structure, a light-emitting structure, and a lampshade structure. The carrier structure includes a carrier body and a first heat-conducting body fixedly disposed inside the carrier body. The carrier body has an outer thread structure disposed on an outer perimeter surface, and the first heat-conducting body has a bottom contacting surface exposed from a bottom side of the carrier body. The suspension structure includes a first suspension element detachably disposed on a top side of the carrier body. The light-emitting structure includes a circuit substrate and a light-emitting unit. The circuit substrate is detachably disposed on the bottom side of the carrier body to contact the bottom contacting surface of the first heat-conducting body, and the light-emitting unit is disposed on the circuit substrate and electrically connected to the circuit substrate. The lampshade structure includes a first position-limiting ring mated with the outer thread structure and rotatably disposed around the carrier body, an inner light-transmitting lampshade mated with the outer thread structure and rotatably disposed around the carrier body to cover the light-emitting structure, and an outer light-transmitting lampshade disposed around the carrier body. The outer light-transmitting lampshade has a position-limiting portion disposed between the first position-limiting ring and the inner light-transmitting lampshade. Therefore, heat generated by the light-emitting unit is guided to the first heat-conducting body through the circuit substrate, and light source generated by the light-emitting unit is projected outwardly through the transparent element.

Yet another one of the embodiments of the instant disclosure provides a LED illumination device, comprising a carrier structure, a suspension structure, and a light-emitting structure. The carrier structure includes a carrier body and a first heat-conducting body fixedly disposed inside the carrier body. The carrier body has an outer thread structure disposed on an outer perimeter surface, and the first heat-conducting body has a bottom contacting surface exposed from a bottom side of the carrier body. The suspension structure includes a first suspension element detachably disposed on a top side of the carrier body. The light-emitting structure includes a circuit substrate and a light-emitting unit. The circuit substrate is detachably disposed on the bottom side of the carrier body to contact the bottom contacting surface of the first heat-conducting body, and the light-emitting unit is disposed on the circuit substrate and electrically connected to the circuit substrate. Therefore, heat generated by the light-emitting unit is guided to the first heat-conducting body through the circuit substrate.

More particularly, the light-emitting structure includes a frame unit and a package unit. The frame unit includes a surrounding light-reflecting resin body surroundingly coated on the top surface of the circuit substrate. The surrounding light-reflecting resin body surrounds the light-emitting unit to form a resin position limiting space on the circuit substrate, and the surrounding light-reflecting resin body has a convex junction portion formed on a top surface thereof. The package unit includes a light-transmitting resin body disposed on the top surface of the circuit substrate for enclosing the light-emitting unit, and the light-transmitting resin body is disposed inside the resin position limiting space and surrounded by the surrounding light-reflecting resin body.

More particularly, the light-emitting unit includes a first light-emitting group and a second light-emitting group, and the light-emitting structure includes a frame unit and a package unit. The frame unit includes a first surrounding light-reflecting resin body surroundingly coated on the top surface of the circuit substrate and a second surrounding light-reflecting resin body surroundingly coated on the top surface of the circuit substrate for surrounding the first surrounding light-reflecting resin body. The first surrounding light-reflecting resin body surrounds the first light-emitting group to form a first resin position limiting space on the circuit substrate, and the second surrounding light-reflecting resin body surrounds the second light-emitting group and the first surrounding light-reflecting resin body to form a second resin position limiting space on the circuit substrate and between the first surrounding light-reflecting resin body and the second surrounding light-reflecting resin body, the first surrounding light-reflecting resin body has a first convex junction portion formed on a top surface thereof, and the second surrounding light-reflecting resin body has a second convex junction portion formed on a top surface thereof. The package unit includes a first light-transmitting resin body and a second light-transmitting resin body disposed on the top surface of the circuit substrate to respectively enclose the first light-emitting group and the second light-emitting group. The first light-transmitting resin body and the second light-transmitting resin body are respectively disposed inside the first resin position limiting space and the second resin position limiting space and respectively surrounded by the first surrounding light-reflecting resin body and the second surrounding light-reflecting resin body. The first light-emitting group includes a plurality of first LED chips disposed on the circuit substrate and electrically connected to the circuit substrate, the second light-emitting group includes a plurality of second LED chips disposed on the circuit substrate and electrically connected to the circuit substrate. The first surrounding light-reflecting resin body and the second surrounding light-reflecting resin body are arranged in a pattern of concentric circles, the second light-emitting group is disposed between the first surrounding light-reflecting resin body and the second surrounding light-reflecting resin body, and the second light-emitting group surrounds the first surrounding light-reflecting resin body.

Hence, the heat generated by the light-emitting unit is guided to the first heat-conducting body through the circuit substrate due to the designs of "the carrier structure including a carrier body and a first heat-conducting body fixedly disposed inside the carrier body, the carrier body having an outer thread structure disposed on an outer perimeter surface, and the first heat-conducting body having a bottom contacting surface exposed from a bottom side of the carrier body" and "the light-emitting structure including a circuit substrate and a light-emitting unit, the circuit substrate being detachably disposed on the bottom side of the carrier body to contact the bottom contacting surface of the first heat-conducting body, and the light-emitting unit being disposed on the circuit substrate and electrically connected to the circuit substrate".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

BRIEF DESCRIPTION OF THE DRAWINGS

The accompanying drawings are included to provide a further understanding of the instant disclosure, and are incorporated in and constitute a part of this specification. The drawings illustrate exemplary embodiments of the instant disclosure and, together with the description, serve to explain the principles of the instant disclosure.

DETAILED DESCRIPTION OF THE PREFERRED EMBODIMENTS

The embodiments of "a LED illumination device" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way. The following term of "heat-conducting" may be replaced by "heat-transmitting" or "heat-dissipating".

First Embodiment

Referring to FIG. 1 to FIG. 4, the first embodiment of the instant disclosure provides a LED illumination device Z, comprising a carrier structure S1, a suspension structure S2, a light-emitting structure S3, and a lampshade structure S4.

Figure 1:
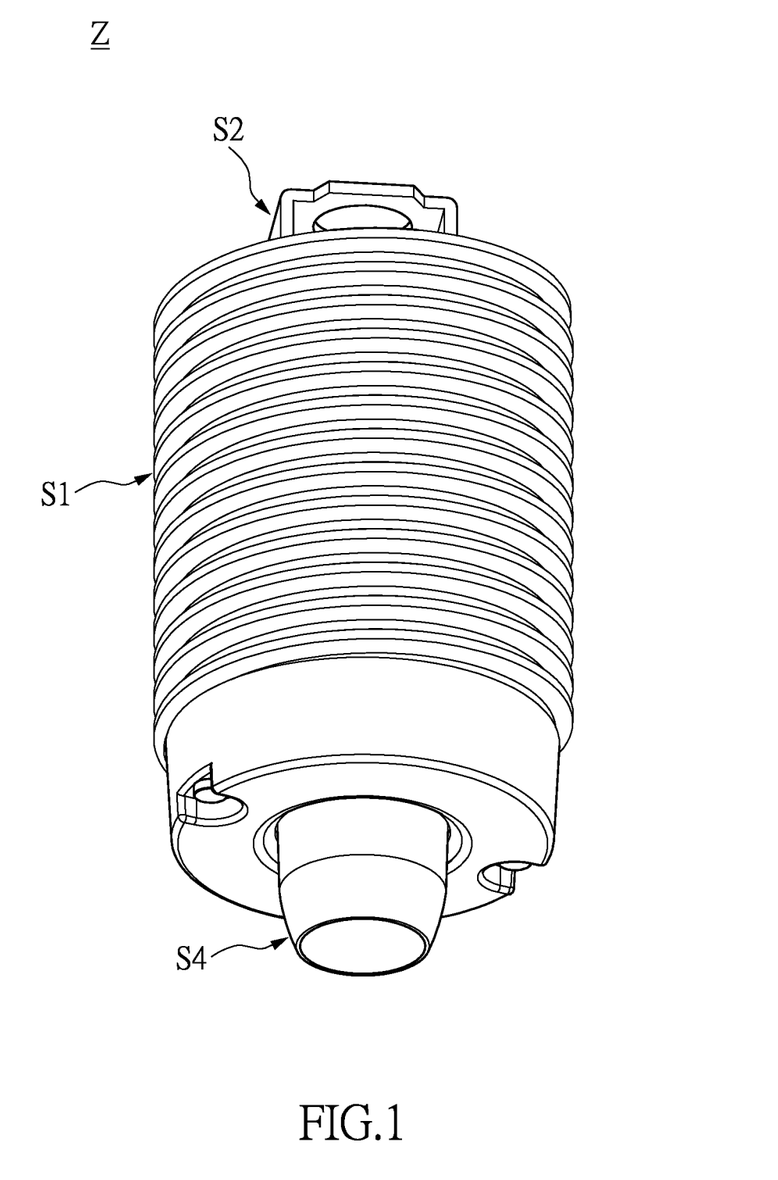
FIG. 1 shows a perspective, assembled, schematic view of the LED illumination device according to the first embodiment of the instant disclosure.
Figure 2:
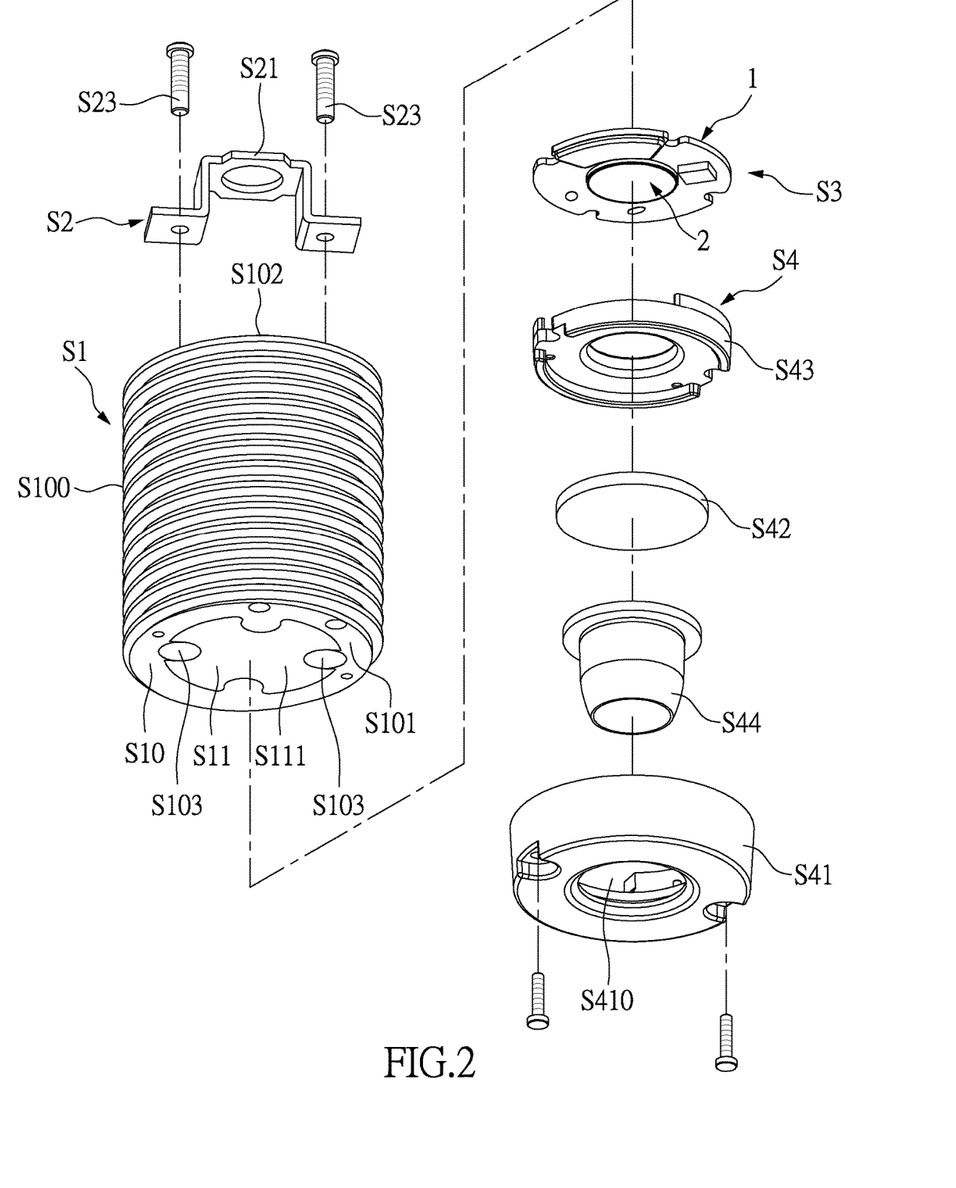
FIG. 2 shows a perspective, exploded, schematic view of the LED illumination device according to the first embodiment of the instant disclosure.
Figure 3:
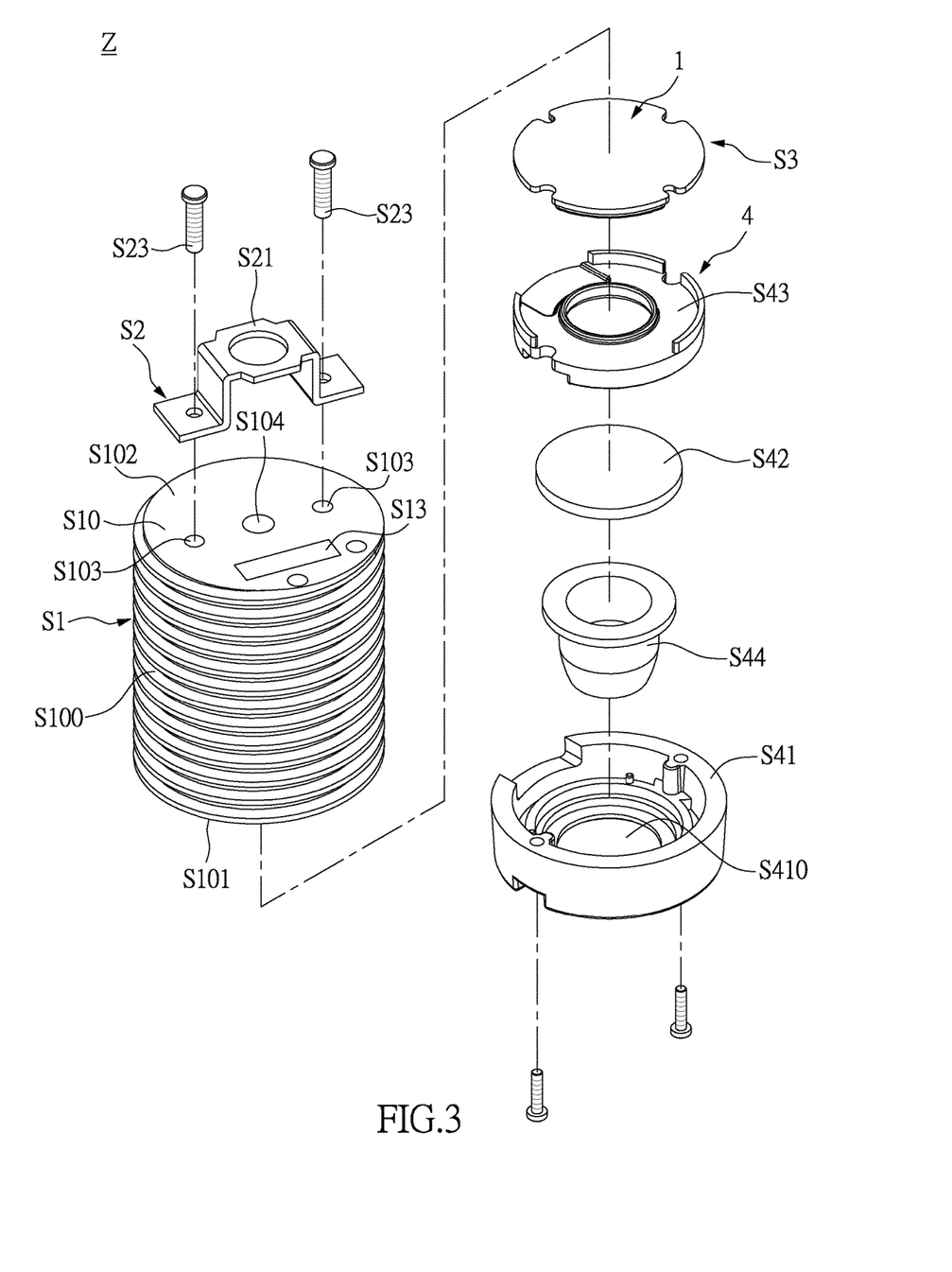
FIG. 3 shows another perspective, exploded, schematic view of the LED illumination device according to the first embodiment of the instant disclosure.
Figure 4:
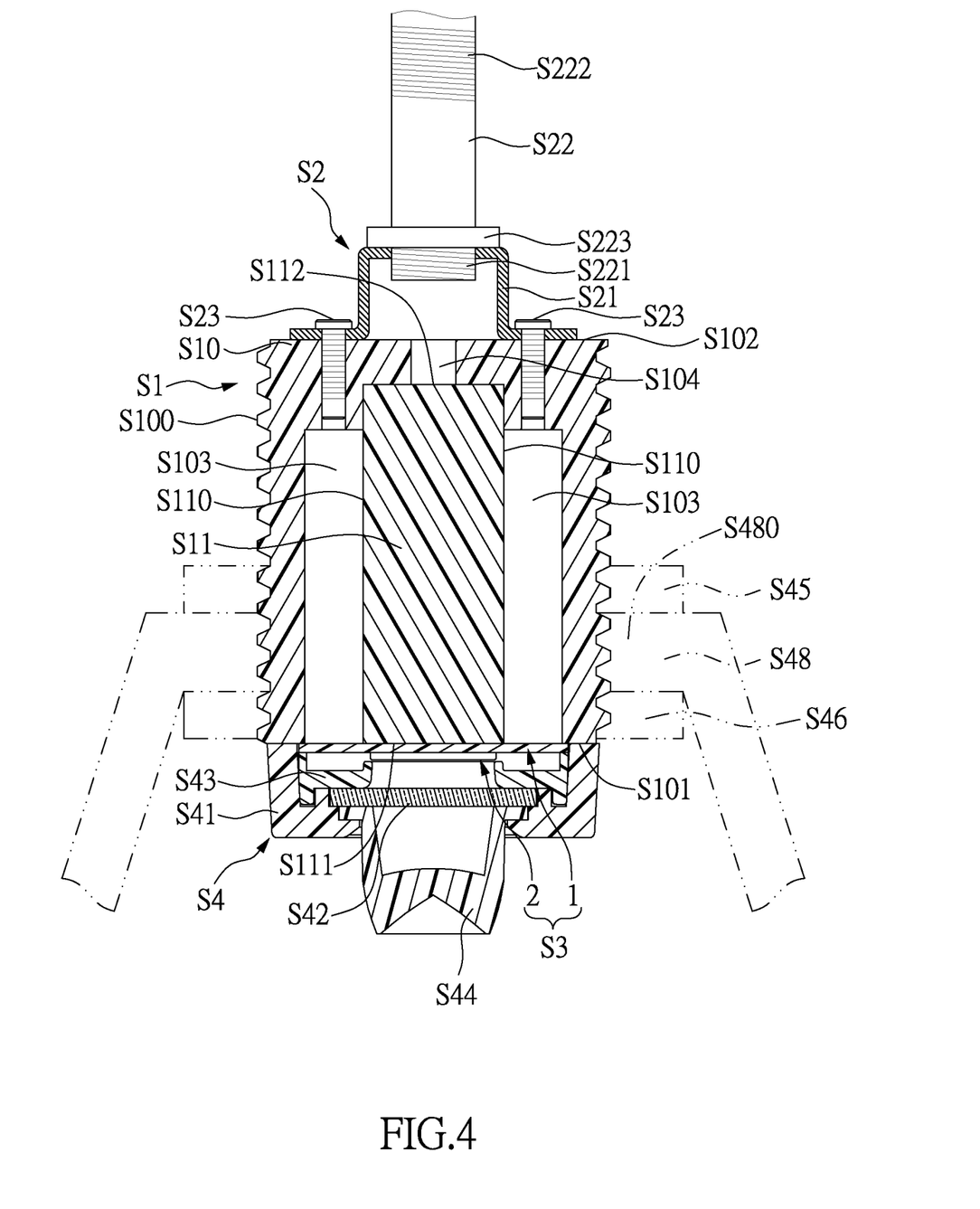
FIG. 4 shows a cross-sectional, schematic view of the LED illumination device according to the first embodiment of the instant disclosure.

First, referring to FIG. 2 to FIG. 4, the carrier structure S1 includes a carrier body S10 and a first heat-conducting body S11 (such as a heat-dissipating body) fixedly disposed inside the carrier body S10. The carrier body S10 has an outer thread structure S100 (such as a screw structure) disposed on an outer perimeter surface, and the first heat-conducting body S11 (such as aluminum or copper material with high heat-transferring capability) has a bottom contacting surface S111 exposed from a bottom side S101 of the carrier body S10. More particularly, the carrier body S10 has at least two first heat-conducting holes S103 (such as heat-dissipating vias) extended from the bottom side S101 of the carrier body S10 to the top side S102 of the carrier body S10 and a second heat-conducting hole S104 extended from the top side S102 of the carrier body S10 to a top contacting surface S112 of the first heat-conducting body S11, and an outer perimeter surface S110 of the first heat-conducting body S11 is partially exposed from the at least two first heat-conducting holes S103.

Moreover, referring to FIG. 2 to FIG. 4, the suspension structure S2 includes a first suspension element S21 detachably disposed on a top side S102 of the carrier body S10. More particularly, the suspension structure S2 includes a second suspension element S22 detachably connected to the first suspension element S21 and a plurality of connection elements S23 (such as screws) detachably connected between the first suspension element S21 and the carrier body S10. In addition, the second suspension element S22 has a first outer thread portion S221 mated with the first suspension element S21, a second outer thread portion S222 separated from the first outer thread portion S221, and a position-limiting portion S223 downwardly abutting against the first suspension element S21.

Furthermore, referring to FIG. 2 and FIG. 4, the light-emitting structure S3 includes a circuit substrate 1 and a light-emitting unit 2. The circuit substrate 1 is detachably disposed on the bottom side S101 of the carrier body S10 to contact the bottom contacting surface S111 of the first heat-conducting body S11, and the light-emitting unit 2 is disposed on the circuit substrate 1 and electrically connected to the circuit substrate 1.

In addition, referring to FIG. 2 and FIG. 4, the lampshade structure S4 includes an opaque outer casing S41 with a light-transmitting opening S410, a transparent element S42 (such as transparent glass), a retaining element S43, and an optical lens S44. More particularly, the opaque outer casing S41 is detachably disposed on the bottom side S101 of the carrier body S10 through screws (not labeled) to cover the light-emitting structure S3, and the transparent element S42 is detachably disposed on the opaque outer casing S41 to enclose the light-transmitting opening S410. Moreover, the light-emitting structure S3 is firmly positioned on the circuit substrate 1 by matching the opaque outer casing S41 and the retaining element S43, so that the circuit substrate 1, the retaining element S43, and the opaque outer casing S41 are stacked on bottom of one another. The optical lens S44 is placed on the transparent element S42 and retained by the opaque outer casing S41.

Please note, as shown in FIG. 4, the lampshade structure S4 includes a first position-limiting ring S45 mated with the outer thread structure S100 and rotatably disposed around the carrier body S10, a second position-limiting ring S46 mated with the outer thread structure S100 and rotatably disposed around the carrier body S10, and an outer light-transmitting lampshade S48 disposed around the carrier body S10. The outer light-transmitting lampshade S48 has a position-limiting portion S480 disposed between the first position-limiting ring S45 and the second position-limiting ring S46.

Therefore, heat generated by the light-emitting unit 2 is guided to the first heat-conducting body S11 through the circuit substrate 1, and light source generated by the light-emitting unit 2 is projected outwardly to outside world through the transparent element S42.

More particularly, the carrier structure S1 includes a color changing layer S13 disposed on the carrier body S10, for example, the color changing layer S13 may be a thermochromic ink as an over-temperature indicator printed on the top side S102 of the carrier body S10, but that is merely an example and is not meant to limit the instant disclosure. The color of the color changing layer S13 is changed according to the heat generated by the light-emitting unit 2, for example, when the heat generated by the light-emitting unit 2 is over a predetermined temperature (such as 70☐), the color of the color changing layer S13 is changed from black color to transparent color, or from transparent color to red color, but that is merely an example and is not meant to limit the instant disclosure.

Second Embodiment

Figure 5:
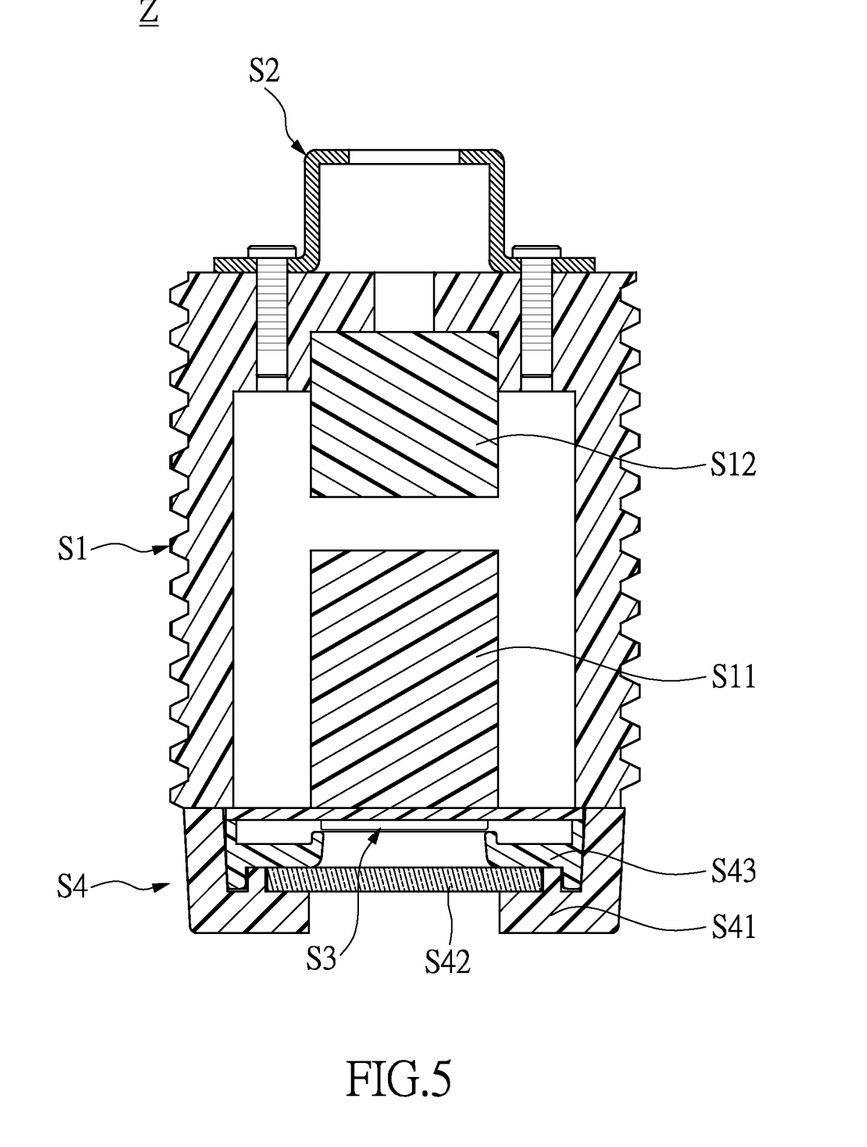
FIG. 5 shows a cross-sectional, schematic view of the LED illumination device according to the second embodiment of the instant disclosure.

Referring to FIG. 5, the second embodiment of the instant disclosure provides a LED illumination device Z, comprising a carrier structure S1, a suspension structure S2, a light-emitting structure S3, and a lampshade structure S4. By comparing FIG. 5 with FIG. 4, the difference between the second embodiment and the first embodiment is as follows: in the second embodiment, the carrier structure S1 includes a second heat-conducting body S12 (such as aluminum or copper material with high heat-transferring capability) disposed inside the carrier body S10 and separated from the first heat-conducting body S11. In addition, the lampshade structure S4 can omit the optical lens S44 of the first embodiment, and the transparent element S42 is a transparent glass.

Third Embodiment

Figure 6:
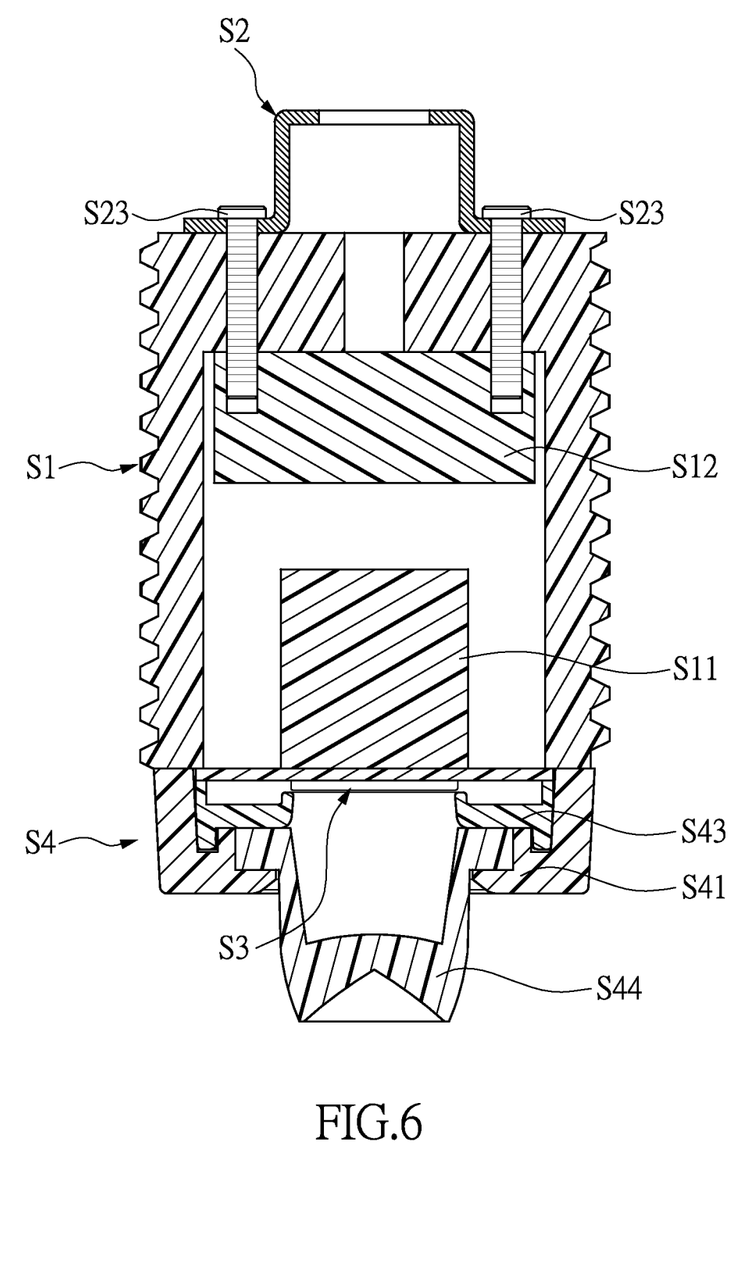
FIG. 6 shows a cross-sectional, schematic view of the LED illumination device according to the third embodiment of the instant disclosure.

Referring to FIG. 6, the third embodiment of the instant disclosure provides a LED illumination device Z, comprising a carrier structure S1, a suspension structure S2, a light-emitting structure S3, and a lampshade structure S4. By comparing FIG. 6 with FIG. 4, the difference between the third embodiment and the first embodiment is as follows: in the third embodiment, the carrier structure S1 includes a second heat-conducting body S12 (such as aluminum or copper material with high heat-transferring capability) disposed inside the carrier body S10 and separated from the first heat-conducting body S11, and the connection elements S23 are connected to the second heat-conducting body S12. In addition, the lampshade structure S4 can omit the transparent element S42 of the first embodiment, and the optical lens S44 is a glass lens.

Fourth Embodiment

Figure 7:
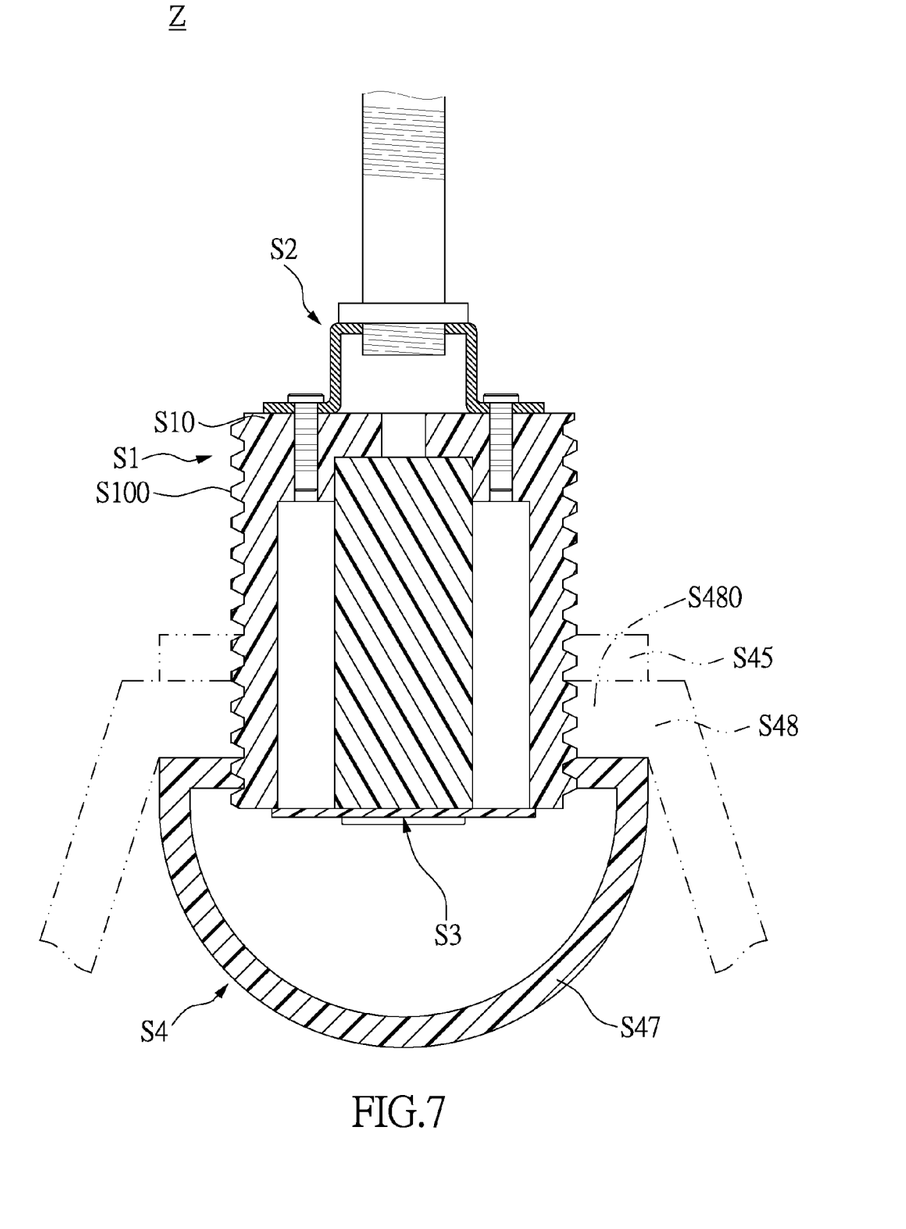
FIG. 7 shows a cross-sectional, schematic view of the LED illumination device according to the fourth embodiment of the instant disclosure.

Referring to FIG. 7, the fourth embodiment of the instant disclosure provides a LED illumination device Z, comprising a carrier structure S1, a suspension structure S2, a light-emitting structure S3, and a lampshade structure S4. By comparing FIG. 7 with FIG. 4, the difference between the fourth embodiment and the first embodiment is as follows: in the fourth embodiment, the lampshade structure S4 includes a first position-limiting ring S45 mated with the outer thread structure S100 and rotatably disposed around the carrier body S10, an inner light-transmitting lampshade S47 mated with the outer thread structure S100 and rotatably disposed around the carrier body S10 to cover the light-emitting structure S3, and an outer light-transmitting lampshade S48 disposed around the carrier body S10. The outer light-transmitting lampshade S48 has a position-limiting portion S480 disposed between the first position-limiting ring S45 and the inner light-transmitting lampshade S47.

Figure 8:
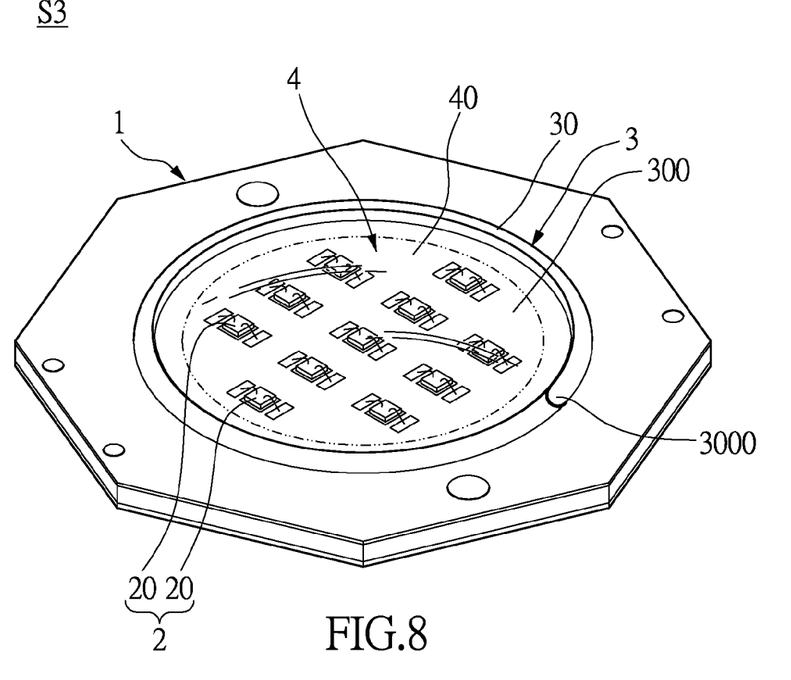
FIG. 8 shows a perspective, schematic view of the LED illumination device using a light-emitting structure according to the instant disclosure.

For example, as shown in FIG. 8, the light-emitting unit 2 includes a plurality of LED chips 20 (bare chips). In addition, the light-emitting structure M1 further includes a frame unit 3 and a package unit 4. The frame unit 3 includes a surrounding light-reflecting resin body 30 surroundingly coated on the top surface of the circuit substrate 1. The surrounding light-reflecting resin body 30 surrounds the light-emitting unit 2 to form a resin position limiting space 300 on the circuit substrate 1, and the surrounding light-reflecting resin body 30 has a convex junction portion 3000 (or a concave junction portion) formed on a top surface thereof. In other words, when the surrounding light-reflecting resin body 30 is going to finish by surroundingly coating, a convex junction portion 3000 (or a concave junction portion) is formed naturally on the surrounding light-reflecting resin body 30. Moreover, the package unit 4 includes a light-transmitting resin body 40 disposed on the top surface of the circuit substrate 1 for enclosing or encapsulating the light-emitting unit 2, and the light-transmitting resin body 40 is disposed inside the resin position limiting space 300 and surrounded by the surrounding light-reflecting resin body 30.

Figure 9:
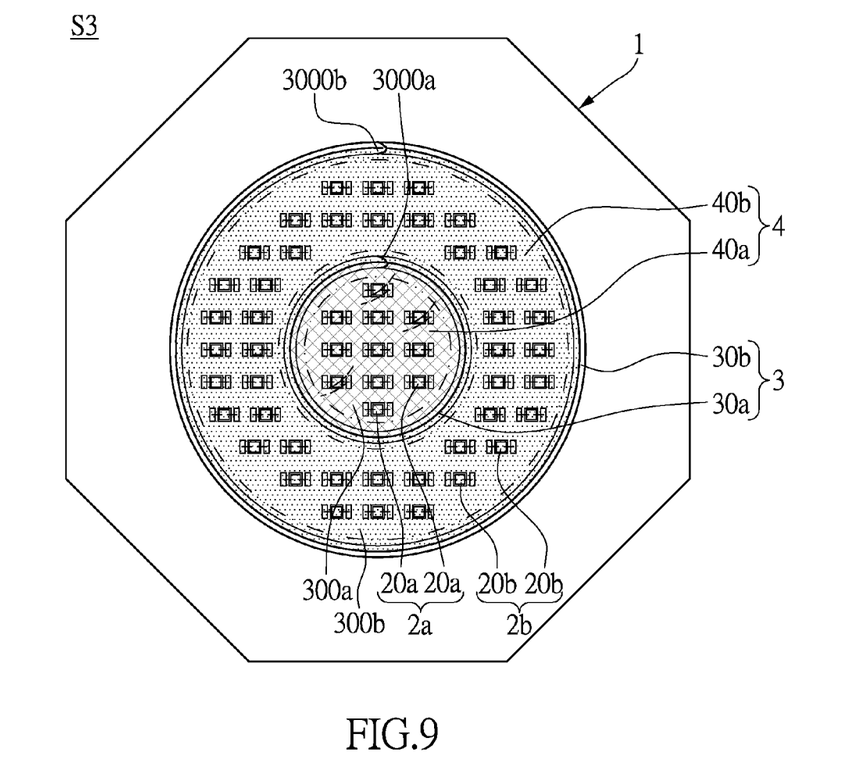
FIG. 9 shows a top, schematic view of the LED illumination device using another light-emitting structure according to the instant disclosure.
Figure 10:
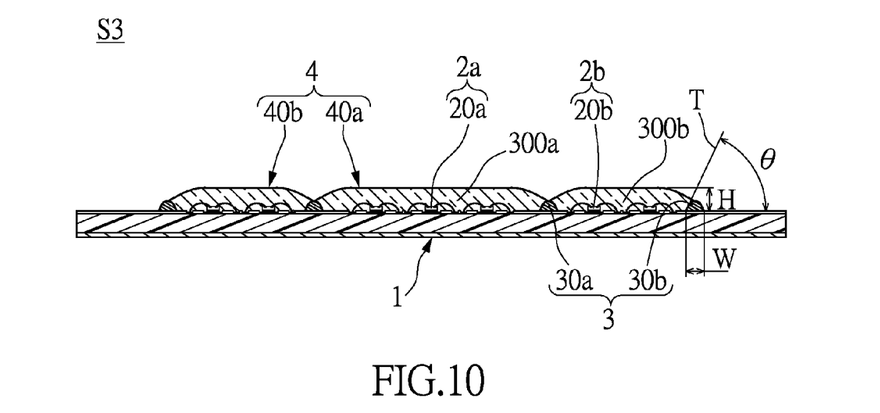
FIG. 10 shows a lateral, cross-sectional, schematic view of the LED illumination device using another light-emitting structure according to the instant disclosure.

For example, referring to FIG. 9 and FIG. 10, the light-emitting unit 2 includes a first light-emitting group 2a and a second light-emitting group 2b. In addition, the light-emitting structure M1 further includes a frame unit 3 and a package unit 4. The frame unit 3 includes a first surrounding light-reflecting resin body 30a surroundingly coated on the top surface of the circuit substrate 1 and a second surrounding light-reflecting resin body 30b surroundingly coated on the top surface of the circuit substrate 1 for surrounding the first surrounding light-reflecting resin body 30a. The first surrounding light-reflecting resin body 30a surrounds the first light-emitting group 2a to form a first resin position limiting space 300a on the circuit substrate 1, and the second surrounding light-reflecting resin body 30b surrounds the second light-emitting group 2b and the first surrounding light-reflecting resin body 30a to form a second resin position limiting space 300b on the circuit substrate 1 and between the first surrounding light-reflecting resin body 30a and the second surrounding light-reflecting resin body 30b. Moreover, the package unit 4 includes a first light-transmitting resin body 40a and a second light-transmitting resin body 40b disposed on the top surface of the circuit substrate 1 to respectively enclose the first light-emitting group 2a and the second light-emitting group 2b, and the first light-transmitting resin body 40a and the second light-transmitting resin body 40b are respectively disposed inside the first resin position limiting space 300a and the second resin position limiting space 300b and respectively surrounded by the first surrounding light-reflecting resin body 30a and the second surrounding light-reflecting resin body 30b.

Following the above description, the first light-emitting group 2a includes a plurality of first LED chips 20a disposed on the circuit substrate 1 and electrically connected to the circuit substrate 1, and the second light-emitting group 2b includes a plurality of second LED chips 20b disposed on the circuit substrate 1 and electrically connected to the circuit substrate 1. In addition, the first surrounding light-reflecting resin body 30a and the second surrounding light-reflecting resin body 30b are arranged in a pattern of concentric circles, the second light-emitting group 2b is disposed between the first surrounding light-reflecting resin body 30a and the second surrounding light-reflecting resin body 30b, and the second light-emitting group 2b surrounds the first surrounding light-reflecting resin body 30a. Furthermore, the first surrounding light-reflecting resin body 30a has a first convex junction portion 3000a (or a first concave junction portion) formed on a top surface thereof, and the second surrounding light-reflecting resin body 30b has a second convex junction portion 3000b (or a second concave junction portion) formed on a top surface thereof.

For example, the method for forming the first surrounding light-reflecting resin body 30a (or the second surrounding light-reflecting resin body 30a) includes: first, surroundingly coating liquid colloid (not shown) on the top surface of the circuit substrate 1. In addition, the liquid colloid can be coated on the circuit substrate 1 to form any shapes according to different requirements (such as a circular shape, a square or a rectangular shape etc.). The thixotropic index of the liquid colloid may be between 4 and 6, the pressure of coating the liquid colloid on the top surface of the circuit substrate 1 may be between 350 kpa and 450 kpa, and the velocity of coating the liquid colloid on the top surface of the circuit substrate 1 may be between 5 mm/s and 15 mm/s. The liquid colloid is surroundingly coated on the top surface of the circuit substrate 1 from an initial point to a terminal point, and the position of the initial point and the position of the terminal point are substantially the same or overlapping, so that the first surrounding light-reflecting resin body 30a (or the second surrounding light-reflecting resin body 30a) has a micro convex portion close to the initial point and the terminal point. Furthermore, the method further includes: hardening or curing the liquid colloid to form a first surrounding light-reflecting resin body 30a. In addition, the liquid colloid is hardened by baking or curing, the baking temperature may be between 120° C. and 140° C., and the baking time may be between 20 minutes and 40 minutes. Therefore, the first surrounding light-reflecting resin body 30a has an arc shape formed on the top surface thereof, the first surrounding light-reflecting resin body 30a has a radius tangent T and the angle θ of the radius tangent T relative to the top surface of the circuit substrate 1 may be between 40° and 50°, the maximum height H of the first surrounding light-reflecting resin body 30a relative to the top surface of the circuit substrate 1 may be between 0.3 mm and 0.7 mm, the width W of the bottom side of the first surrounding light-reflecting resin body 30a may be between 1.5 mm and 3 mm, the thixotropic index of the first surrounding light-reflecting resin body 30a may be between 4 and 6, and the first surrounding light-reflecting resin body 30a is formed by mixing inorganic additive with white thermohardening colloid.

Figure 11:
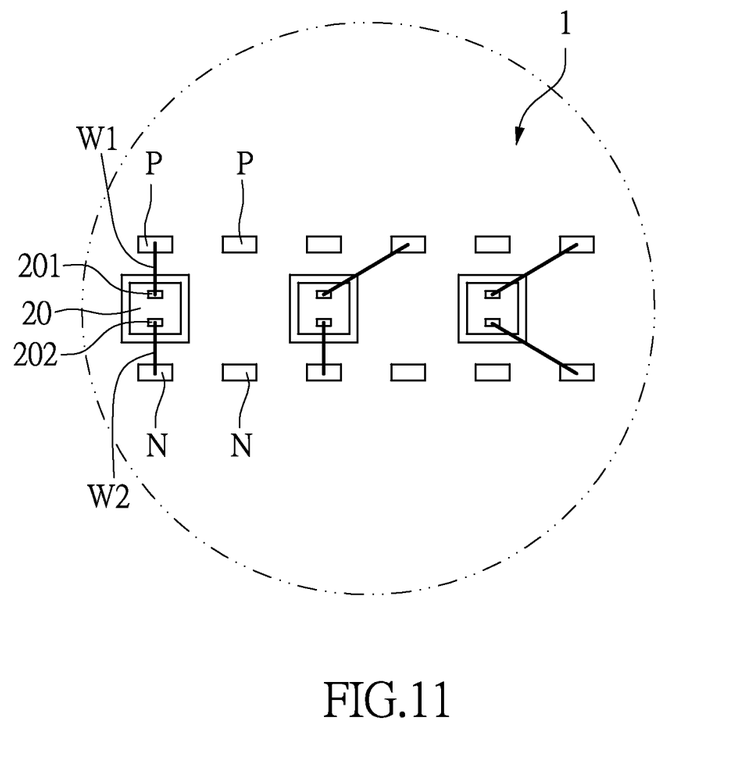
FIG. 11 shows a partial, top, schematic view of the circuit substrate of the LED illumination device according to the instant disclosure.

Please note, referring to FIG. 11, the circuit substrate 1 includes a plurality of positive pads P and negative pads N disposed on the top surface of the circuit substrate 1. Each LED chip 20 has a positive electrode 201 and a negative electrode 202. The positive electrode 201 of each LED chip 20 corresponds to at least two of the positive pads P, and the negative electrode 202 of each LED chip 20 corresponds to at least two of the negative pads N. In addition, one of positive conductive wires W1 is electrically connected between the positive electrode 201 of each LED chip 20 and one of the at least two positive pads P, and one of negative conductive wire W2 is electrically connected between the negative electrode 202 of each LED chip 20 and one of the at least two negative pads N. Hence, the positive electrode 201 of each LED chip 20 has at least one standby positive pad P, and the negative electrode 202 of each LED chip 20 has at least one standby negative pad N.

Following the above description, when a first end of the positive conductive wire W1 does not correctly connect with first one of the at least two positive pads P (it means that the positive conductive wire W1 does not electrically connect with the first one of the at least two positive pads P (such as floating solder)), the manufacturer can make the same first end of the positive conductive wire W1 connect to another one of the at least two positive pads P without cleaning solder splash on the surface of the first one of the at least two positive pads P, so that the wire-bonding time (or the wire-bonding efficiency) is decreased and the wire-bonding yield is increased.

Following the above description, when a first end of the negative conductive wire W2 does not correctly connect with first one of the at least two negative pads N (it means that the negative conductive wire W2 does not electrically connect with the first one of the at least two negative pads N (such as floating solder)), the manufacturer can make the same first end of the negative conductive wire W2 connect to another one of the at least two negative pads N without cleaning solder splash on the surface of the first one of the at least two negative pads N, so that the wire-bonding time (or the wire-bonding efficiency) is decreased and the wire-bonding yield is increased.

In conclusion, the heat generated by the light-emitting unit 2 is guided to the first heat-conducting body S11 through the circuit substrate 1 due to the designs of "the carrier structure S1 including a carrier body S10 and a first heat-conducting body S11 fixedly disposed inside the carrier body S10, the carrier body S10 having an outer thread structure S100 disposed on an outer perimeter surface, and the first heat-conducting body S11 having a bottom contacting surface S111 exposed from a bottom side S101 of the carrier body S10" and "the light-emitting structure S3 including a circuit substrate 1 and a light-emitting unit 2, the circuit substrate 1 being detachably disposed on the bottom side S101 of the carrier body S10 to contact the bottom contacting surface S111 of the first heat-conducting body S11, and the light-emitting unit 2 being disposed on the circuit substrate 1 and electrically connected to the circuit substrate 1".

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. An LED illumination device, comprising:
    a carrier structure including a carrier body and a first heat-conducting body fixedly disposed inside the carrier body, wherein the carrier body has an outer thread structure disposed on an outer perimeter surface, and the first heat-conducting body has a bottom contacting surface exposed from a bottom side of the carrier body;
    a suspension structure including a first suspension element detachably disposed on a top side of the carrier body;
    a light-emitting structure including a circuit substrate and a light-emitting unit, wherein the circuit substrate is detachably disposed on the bottom side of the carrier body to contact the bottom contacting surface of the first heat-conducting body, and the light-emitting unit is disposed on the circuit substrate and electrically connected to the circuit substrate; and
    a lampshade structure including an opaque outer casing with a light-transmitting opening and a transparent element, wherein the opaque outer casing is detachably disposed on the bottom side of the carrier body to cover the light-emitting structure, and the transparent element is detachably disposed on the opaque outer casing to enclose the light-transmitting opening;
    wherein heat generated by the light-emitting unit is guided to the first heat-conducting body through the circuit substrate, and light source generated by the light-emitting unit is projected outwardly through the transparent element;
    wherein the suspension structure includes a second suspension element detachably connected to the first suspension element and a plurality of connection elements detachably connected between the first suspension element and the carrier body, and the second suspension element has a first outer thread portion mated with the first suspension element and a second outer thread portion separated from the first outer thread portion.

2. The LED illumination device of claim 1, wherein wherein the second suspension element has a position-limiting portion downwardly abuts against the first suspension element.

3. The LED illumination device of claim 2, wherein the carrier structure includes a second heat-conducting body disposed inside the carrier body and separated from the first heat-conducting body, and the connection elements are connected to the second heat-conducting body.

4. The LED illumination device of claim 1, wherein the carrier body has at least two first heat-conducting holes extended from the bottom side of the carrier body to the top side of the carrier body and a second heat-conducting hole extended from the top side of the carrier body to a top contacting surface of the first heat-conducting body, and an outer perimeter surface of the first heat-conducting body is partially exposed from the at least two first heat-conducting holes.

5. The LED illumination device of claim 1, wherein the light-emitting structure includes:
    a frame unit including a surrounding light-reflecting resin body surroundingly coated on the top surface of the circuit substrate, wherein the surrounding light-reflecting resin body surrounds the light-emitting unit to form a resin position limiting space on the circuit substrate, and the surrounding light-reflecting resin body has a convex junction portion formed on a top surface thereof; and
    a package unit including a light-transmitting resin body disposed on the top surface of the circuit substrate for enclosing the light-emitting unit, wherein the light-transmitting resin body is disposed inside the resin position limiting space and surrounded by the surrounding light-reflecting resin body.

6. The LED illumination device of claim 1, wherein the light-emitting unit includes a first light-emitting group and a second light-emitting group, and the light-emitting structure includes:
    a frame unit including a first surrounding light-reflecting resin body surroundingly coated on the top surface of the circuit substrate and a second surrounding light-reflecting resin body surroundingly coated on the top surface of the circuit substrate for surrounding the first surrounding light-reflecting resin body, wherein the first surrounding light-reflecting resin body surrounds the first light-emitting group to form a first resin position limiting space on the circuit substrate, and the second surrounding light-reflecting resin body surrounds the second light-emitting group and the first surrounding light-reflecting resin body to form a second resin position limiting space on the circuit substrate and between the first surrounding light-reflecting resin body and the second surrounding light-reflecting resin body, the first surrounding light-reflecting resin body has a first convex junction portion formed on a top surface thereof, and the second surrounding light-reflecting resin body has a second convex junction portion formed on a top surface thereof; and a package unit including a first light-transmitting resin body and a second light-transmitting resin body disposed on the top surface of the circuit substrate to respectively enclose the first light-emitting group and the second light-emitting group, wherein the first light-transmitting resin body and the second light-transmitting resin body are respectively disposed inside the first resin position limiting space and the second resin position limiting space and respectively surrounded by the first surrounding light-reflecting resin body and the second surrounding light-reflecting resin body;

wherein the first light-emitting group includes a plurality of first LED chips disposed on the circuit substrate and electrically connected to the circuit substrate, the second light-emitting group includes a plurality of second LED chips disposed on the circuit substrate and electrically connected to the circuit substrate, wherein the first surrounding light-reflecting resin body and the second surrounding light-reflecting resin body are arranged in a pattern of concentric circles, the second light-emitting group is disposed between the first surrounding light-reflecting resin body and the second surrounding light-reflecting resin body, and the second light-emitting group surrounds the first surrounding light-reflecting resin body.

7. An LED illumination device, comprising:

a carrier structure including a carrier body and a first heat-conducting body fixedly disposed inside the carrier body, wherein the carrier body has an outer thread structure disposed on an outer perimeter surface, and the first heat-conducting body has a bottom contacting surface exposed from a bottom side of the carrier body;

a suspension structure including a first suspension element detachably disposed on a top side of the carrier body;

a light-emitting structure including a circuit substrate and a light-emitting unit, wherein the circuit substrate is detachably disposed on the bottom side of the carrier body to contact the bottom contacting surface of the first heat-conducting body, and the light-emitting unit is disposed on the circuit substrate and electrically connected to the circuit substrate; and a lampshade structure including a first position-limiting ring mated with the outer thread structure and rotatably disposed around the carrier body, an inner light-transmitting lampshade mated with the outer thread structure and rotatably disposed around the carrier body to cover the light-emitting structure, and an outer light-transmitting lampshade disposed around the carrier body, wherein the outer light-transmitting lampshade has a position-limiting portion disposed between the first position-limiting ring and the inner light-transmitting lampshade;

wherein heat generated by the light-emitting unit is guided to the first heat-conducting body through the circuit substrate, and light source generated by the light-emitting unit is projected outwardly through the transparent element.

8. The LED illumination device of claim 7, wherein the light-emitting structure includes:

a frame unit including a surrounding light-reflecting resin body surroundingly coated on the top surface of the circuit substrate, wherein the surrounding light-reflecting resin body surrounds the light-emitting unit to form a resin position limiting space on the circuit substrate, and the surrounding light-reflecting resin body has a convex junction portion formed on a top surface thereof; and a package unit including a light-transmitting resin body disposed on the top surface of the circuit substrate for enclosing the light-emitting unit, wherein the light-transmitting resin body is disposed inside the resin position limiting space and surrounded by the surrounding light-reflecting resin body.

9. The LED illumination device of claim 7, wherein the light-emitting unit includes a first light-emitting group and a second light-emitting group, and the light-emitting structure includes:

a frame unit including a first surrounding light-reflecting resin body surroundingly coated on the top surface of the circuit substrate and a second surrounding light-reflecting resin body surroundingly coated on the top surface of the circuit substrate for surrounding the first surrounding light-reflecting resin body, wherein the first surrounding light-reflecting resin body surrounds the first light-emitting group to form a first resin position limiting space on the circuit substrate, and the second surrounding light-reflecting resin body surrounds the second light-emitting group and the first surrounding light-reflecting resin body to form a second resin position limiting space on the circuit substrate and between the first surrounding light-reflecting resin body and the second surrounding light-reflecting resin body, the first surrounding light-reflecting resin body has a first convex junction portion formed on a top surface thereof, and the second surrounding light-reflecting resin body has a second convex junction portion formed on a top surface thereof; and a package unit including a first light-transmitting resin body and a second light-transmitting resin body disposed on the top surface of the circuit substrate to respectively enclose the first light-emitting group and the second light-emitting group, wherein the first light-transmitting resin body and the second light-transmitting resin body are respectively disposed inside the first resin position limiting space and the second resin position limiting space and respectively surrounded by the first surrounding light-reflecting resin body and the second surrounding light-reflecting resin body;

wherein the first light-emitting group includes a plurality of first LED chips disposed on the circuit substrate and electrically connected to the circuit substrate, the second light-emitting group includes a plurality of second LED chips disposed on the circuit substrate and electrically connected to the circuit substrate, wherein the first surrounding light-reflecting resin body and the second surrounding light-reflecting resin body are arranged in a pattern of concentric circles, the second light-emitting group is disposed between the first surrounding light-reflecting resin body and the second surrounding light-reflecting resin body, and the second light-emitting group surrounds the first surrounding light-reflecting resin body.

10. An LED illumination device, comprising:

a carrier structure including a carrier body and a first heat-conducting body fixedly disposed inside the carrier body, wherein the carrier body has an outer thread structure disposed on an outer perimeter surface, and the first heat-conducting body has a bottom contacting surface exposed from a bottom side of the carrier body;

a suspension structure including a first suspension element detachably disposed on a top side of the carrier body; and a light-emitting structure including a circuit substrate and a light-emitting unit, wherein the circuit substrate is detachably disposed on the bottom side of the carrier body to contact the bottom contacting surface of the first heat-conducting body, and the light-emitting unit is disposed on the circuit substrate and electrically connected to the circuit substrate;

wherein heat generated by the light-emitting unit is guided to the first heat-conducting body through the circuit substrate;

wherein the carrier structure includes a color changing layer disposed on the carrier body, and the color of the color changing layer is changed according to the heat generated by the light-emitting unit.

* * * * *